United States Patent [19]
Oktay et al.

[11] Patent Number: 5,647,429
[45] Date of Patent: Jul. 15, 1997

[54] COUPLED, FLUX TRANSFORMER HEAT PIPES

[76] Inventors: Sevgin Oktay, 097 Fox Run, Poughkeepsie, N.Y. 12603; George Paul Peterson, 6623 Westbury Oaks Ct., West Springfield, Va. 22152

[21] Appl. No.: 590,869

[22] Filed: Jan. 24, 1996

Related U.S. Application Data

[63] Continuation of Ser. No. 260,534, Jun. 16, 1994, abandoned.
[51] Int. Cl.$^6$ ............................................. F28D 15/00
[52] U.S. Cl. .................. 165/104.26; 361/700; 257/715; 165/104.33
[58] Field of Search ................ 165/104.26, 104.33, 165/104.17, 913, 911, 104.21; 257/715, 714; 361/710, 709, 700

[56] References Cited

U.S. PATENT DOCUMENTS

| | | | |
|---|---|---|---|
| 3,782,449 | 1/1974 | Busse et al. | 165/104.26 X |
| 3,913,665 | 10/1975 | Franklin et al. | 165/104.26 |
| 3,921,710 | 11/1975 | Katayama | 165/104.26 |
| 4,011,104 | 3/1977 | Basiulis | 165/104.33 X |
| 4,116,266 | 9/1978 | Sawata et al. | 165/104.26 |
| 4,381,818 | 5/1983 | Sachar et al. | 165/133 |
| 4,565,243 | 1/1986 | Ernst et al. | 165/104.26 |
| 4,607,277 | 8/1986 | Hassan et al. | 357/81 |
| 4,671,348 | 6/1987 | Bauer | 165/41 |
| 4,917,177 | 4/1990 | Gernert | 165/104.26 |
| 4,951,740 | 8/1990 | Peterson et al. | 165/32 |
| 5,117,901 | 6/1992 | Cullimore | 165/104.26 X |
| 5,168,921 | 12/1992 | Meyer, IV | 165/104.33 X |
| 5,309,986 | 5/1994 | Itoh | 165/104.33 X |
| 5,343,940 | 9/1994 | Jean | 165/104.33 |
| 5,386,143 | 1/1995 | Fitch | 165/104.33 X |
| 5,508,884 | 4/1996 | Brunet et al. | 165/104.33 X |

FOREIGN PATENT DOCUMENTS 0031795  2/1982  Japan.

OTHER PUBLICATIONS

DOCN 000009921 Nov. 11, 1993 Abstract Only Truscello, "Liquid Metal Heat Pipe Jet Propulsion Lab". Pasadena CA.
DOCN 0000019626 Abstract Only Apr. 8, 1993 Lewis Res. CTR. "Design & Analysis Code . . . " 1989 Research & Technology.
DOCN 000027024 Dec. 15, 1993 Abstract Only Glenn, "Space Station Heat Pipe . . . " L.B. Johnson SP CTR R&T Report 1991.
DOCN 000018860 Oct. 12, 1992 JFK Space Center "Mobile Heat Pipe Air Cond'r".
ISBN0-7923-2736-5 1994 Oktay, "Beyond Thermal Limits In . . . " Cooling of Elec. Sys., Kluwer pp. 47-70.
Sep. 1982 Oktay, "Departure in Natural Convection (DNC) in Low-Temp". Boil. Heat Proc. of 7th Int. Heat Conf pp. 113-118.
H. Parsapour, Modular Heat Sink, Apr. 1975, p. 3313 of IBM Technical Disclosure Bulletin vol. 17 No. 11.

*Primary Examiner*—John Rivell
*Assistant Examiner*—Christopher Atkinson
*Attorney, Agent, or Firm*—Graham S. Jones, II

[57] ABSTRACT

A heat pipe includes a heat input end including an evaporator an adiabatic section and an output end including a condenser, with the evaporator and the condenser joined by a hollow adiabatic section containing a wicking material and a coolant, a heat pipe including a plurality of heat pipe stages connected in cascade with the condenser of the preceding stage secured to the evaporator of the succeeding stage each of the stages having a larger internal cross-sectional area at the condenser than at the evaporator. The stages of heat pipes are interconnected to form an integral part of a unitary heat pipe, with the condenser and the evaporator screwed together, or individual heat pipes are interconnected by sleeves of variable lengths screwed one into the other. A heat pipe can be composed of flexible material, and more particularly the heat pipe is connected to the box containing the device as a heat sink. The heat pipes can increase in diameter in steps stage by stage; or the heat pipes increase in diameter linearly stage by stage and linearly within a stage.

20 Claims, 4 Drawing Sheets

COUPLED, FLUX TRANSFORMER HEAT PIPES

The application is a continuation of application Ser. No. 08/260,534 filed on Jun. 16, 1994, now abandoned.

BACKGROUND OF THE INVENTION

1. Field of the Invention

This invention relates to heat transfer devices and more particularly to heat pipe systems.

2. Description of Related Art

One of the limitations of a heat pipe is its length. That limitation is governed by the amount of heat it can transport per unit time. Another limitation of a heat pipe is its ability to "transform", i.e. to redistribute the heat flux from one end of a heat pipe to the other end of the heat pipe. By removing the length limitation and by making a flux transformer possible, the opportunities for heat pipes are enhanced by orders of magnitude in applications such as space technology where thermal control of power management systems pose significant challenges.

Some recent work pertaining to heat pipes includes a liquid metal heat pipe which is designed to be lightweight and capable of production in large quantities at relatively low cost, as described by Vincent C. Truscello, in "Liquid Metal Heat Pipe," DOCN 000009921, Jet Propulsion Laboratory, Pasadena, Calif. (1993). The key to light weight is an inner structure made of 2 mil foil with a pattern of 3.5 mil diameter holes. Another way of achieving light weight is to consider different diameter tubes since length is no longer a limitation. In another application, current heat rejection systems for spacecraft are made primarily of heat pipes and pumped loops. In "Design and Analysis Code for Combined Pumped-Loop, Heat Pipe Radiator," DOCN 0000019626, Lewis Research Center, Cleveland, Ohio (1989) it is stated that although a heat pipe system often has a lower mass than a comparable pumped-loop system, it is often impossible to configure systems to use heat pipes alone. One of the reasons for this is the length limitation. Here again, coupled heat pipes may alleviate that limitation.

It has been shown there that the high capacity heat pipe radiators offer several advantages over conventional heat-rejection methods as described by Steven D. Glenn in "Space Station Heat Pipe Advanced Radiator Element II," Research and Technology Report, Lyndon B. Johnson Space Center, Houston, Tex. (1991)

It has been demonstrated that the innovative use of heat pipes in different configurations and for different purposes allows them to provide the same performances as a conventional air conditioning system with three times the capacity and size in "Mobile Heat Pipe Air Conditioner", DOCN 000018860, John F. Kennedy Space Center, Fla. (1993.) In addition, they state its capability of maintaining the supply air within required specifications. That heat pipe air conditioning system permits savings within the range from 65% to 70% over conventional air conditioning systems.

An article by S. Oktay "Beyond Thermal Limits in Computer Systems Cooling" Cooling of Electronic Systems, Editors S. Kakac and H. Yuncu, The Netherlands (1994) includes a description of the related art as well as a description of aspects of this invention. That description is incorporated herein by reference. Some of the material described therein is included herein as well.

In electronics, the surface area of devices has been shrinking so fast that cooling has become more and more of a challenge. The force behind shrinking dimensions is the drive to reduce electrical signal propagation times for higher and higher system performance. It is that linkage between thermal and electrical parameters which sheds light on the nature of thermal limits, if any.

Currently the computer industry as well as the computer itself are being reshaped. From the mainframes of the previous decades to the client-servers of today and on to the projected PC in every home in the year 2001, the trend is for information not only at the finger tips, but also, one may say, surrounding the body. Consider, for example, a computer in the form of a "shawl" slung over the shoulder where an integrated computer-fax-telephone machine is comfortably cooled not exactly by perspiration, but, possibly, by transpiration.

The "downward mobility" from general purpose computers to desktop computers to mobile computers is driven by the ever increasing improvements in the semiconductor technology, namely the ability to be able to squeeze many more transistors into a given area.

Accompanying the dizzying improvements in the hardware technology there have also been some significant improvements, albeit at a slower rate, in the software arena, such as parallel programming. Thus a multiplicity of single chip processors supported by appropriate parallel processing programs encourages "upward mobility" to economically attractive "Next Frames", or Next Generation Mainframes, and even to application specific super computers, for that matter. Hence, if improvements in hardware technology alone accelerate "downward mobility" towards smaller computers and mobile computers, coupling that with improvements in parallel processing encourages possibly affordable "upward mobility" as well.

In terms of cooling, all this has significant implications. How does one cool a "10 MIP computer shawl" slung over a shoulder while carrying inside it chip(s) with hundreds of thousands of circuits? How is a 500 MIPS DeskTop of the mid-90's to be cooled without the noise of cooling blowers polluting the quiet of the office? How is a 1000 MIPS or, say, a 10 BIPS NextFrame of year 2001 to be cooled?

Whether it is "downward," or "upward" mobility in computers, what is clear is that miniaturization of technology is driving to higher power densities at the junction level, while the reduction in absolute power per function is reducing the total heat dissipated by the system. In other words, the trend is towards far more MIPS/MW, or for more work and less "hot air." A decade ago, computers could perform about 100 MIPS per MegaWatt of energy and in the year 2000 they are expected to do more with less about 1000 MIPS, or 1 BIPS per MegaWatt. With CMOS technology, this could change dramatically to tens of BIPS per MegaWatt.

This trend has interesting implications. While it is becoming "easier" to dissipate heat at the system level, because there is less of it to eliminate per function, the challenge of cooling is being pushed more and more towards the source where the heat is generated, i.e., the junction and the chip. Taking some liberties with the symbolic "computer shawl" of the year 2001, it would not be too desirable to mount a huge heat sink on a single-chip-processor computer with a blower blowing at 100 liters per second while carrying a shawl around the shoulder of the user. Nor would it be attractive to mount a relatively small micro-channel water-cooled heat sink on the chip and then again strap a jug of water on the back to cool the shawl. In today's mainframes or other relatively large systems of several chips, the usual mechanical aids for cooling the chips could be buried inside the "big-footed" systems. However, just like the trend for smaller devices on chips, and fewer chips in a system and hence physically much smaller but much more powerful systems, the same trend for cooling is needed where the cooling hardware is commensurate with the size of the overall system. To this end, it is helpful to examine the thermal limits in electronic packaging.

Figure 1:
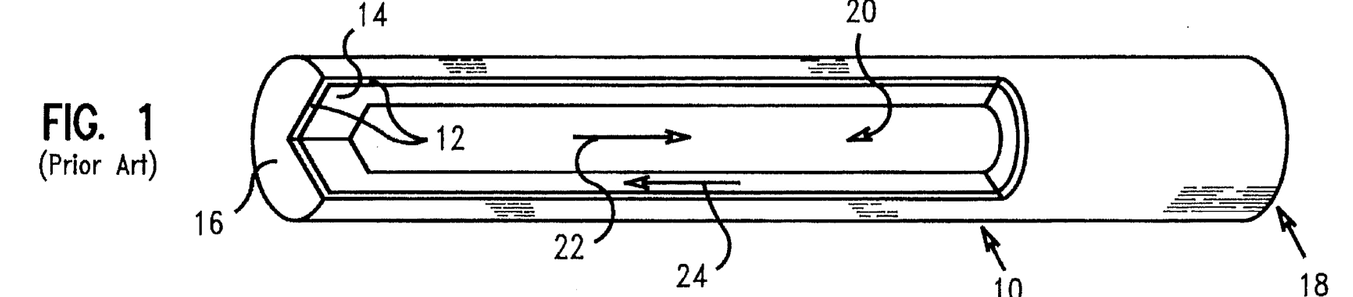
FIG. 1 shows a perspective view of a prior art heat pipe device comprising a sealed container in the form of a cylindrical tube.

Heat pipes are well known devices used for cooling. FIG. 1 shows a perspective view of a prior art heat pipe device comprising a sealed container 10 in the form of a cylindrical tube 12 cut away for convenience of illustration. (Heat pipes typically consist of a sealed container (usually a cylindrical tube). The tube 12 is lined internally, on its inner walls, with a cylindrically shaped wicking material 14. The container is evacuated and backfilled with just enough liquid coolant to fully saturate the wicking material 14.

When the first (proximal) end of the container 10 known as the evaporator 16 is heated, the working fluid coolant at the evaporator end of the container 10 is vaporized into a coolant gas, thereby absorbing substantial heat because of the change of state from liquid to gas. The resulting high vapor pressure resulting from the vaporization drives the coolant gas (vapor) in the vapor flow direction 22 from the evaporator section 16 through the adiabatic section (arrow 22) to the condenser section 18 at the distal end (known as the condenser 18) of the container 10.

At the condenser 18, when the condenser 18 is at a lower temperature than the coolant gas, the coolant gas (vapor) condenses back into the liquid state thereby releasing the latent heat of vaporization from the coolant gas to the condenser 18. The capillary forces in the wicking material 14 then pump the coolant liquid back along a path in the direction indicated by liquid flow arrow 24 to the evaporator end 16 of the container 10.

The cycle is continuous and is repeated so long as heat is supplied to the evaporator and the condenser condenses the vapor. Since this embodiment uses the latent heat of vaporization of the working fluid (coolant) as opposed to sensible heat, the temperature difference between the heat source at the opposite ends represented by the evaporator 16 and the condenser 18 is very small.

Consequently, the equivalent thermal conductivity of such a heat pipe can be several orders of magnitude greater than that of a device such as a solid copper rod of the same dimensions. The heat transport capability of the heat pipe is a function of the ease of circulation of the working fluid (coolant). There is a definite relationship between the length of a heat pipe and the load it can carry before the capillary pumping mechanism fails. Heat pipes use coolants such as ammonia, fluorocarbon (Freon-21 trandemark of E.I. dupont de Nemours), methanol, water and other fluids with suitable boiling points among other characteristics such as high surface tension.

As to wicking materials, large internal pores are necessary in a direction normal to the liquid flow path to minimize liquid flow resistance. Small surface pores develop high capillary pressure and a highly conductive heat flow path. Homogeneous wicks and composite wicks are available. The types of wick materials available include wrapped screens, sintered metal, axial grooves, annular and crescent wicks, and artery wicks. Composite wicks include composite, screen-covered groove, slab and tunnel wicks.

SUMMARY OF THE INVENTION

In accordance with this invention, a heat pipe includes an input end including an evaporator, an adiabatic section and an output end including a condenser, with the evaporator and the condenser joined by a hollow adiabatic section containing a wicking material and a coolant. The heat pipe has a larger internal cross-sectional area at the condenser than at the evaporator.

Preferably, the heat pipe includes a plurality of heat pipe stages connected in cascade with the condenser of the preceding stage secured to the corresponding evaporator of the succeeding stage.

Preferably, the heat pipe stages have the condensers and the corresponding evaporators screwed together.

Preferably, the stages of heat pipes are interconnected to form an integral part of a unitary heat pipe.

Preferably, individual heat pipes are interconnected by sleeves of variable lengths screwed one into the other.

Preferably, the heat pipe is composed of flexible material.

In accordance with another aspect of this invention, a heat pipe includes a heat input end including an evaporator an adiabatic section and an output end including a condenser, with the evaporator and the condenser joined by a hollow adiabatic section containing a wicking material and a coolant. The heat pipe includes a plurality of heat pipe stages connected in cascade with the condenser of the preceding stage secured to the evaporator of the succeeding stage each of the stages having a larger internal cross-sectional area at the condenser than at the evaporator.

Preferably, the heat pipe stages with the condenser and the evaporator screwed together.

Preferably, the stages of heat pipes are interconnected to form an integral part of a unitary heat pipe.

Preferably, individual heat pipes are interconnected by sleeves of variable lengths screwed one into the other.

Preferably, the heat pipe stages have the condenser and the evaporators screwed together.

Preferably, the heat pipe is composed of flexible material, and more particularly the heat pipe is connected to the box containing the device as a heat sink.

Preferably, the heat pipes increase in diameter in steps stage by stage. Alternatively, it is preferred that the heat pipes increase in diameter linearly stage by stage and preferably linearly within a stage.

Some advantages of the "coupled, flux transformer over conventional heat pipes are as follows:
1. removal of length limitation.
2. addition of flux transforming capability.

Those advantages greatly enhance the value of heat pipes as contrasted to conventional cooling systems. Consider, for example, the hat pipe radiator systems for the Space Station Freedom (SSF.) As stated above it has been shown there that the high capacity heat pipe radiators offer several advantages over conventional heat-rejection methods as described by Steven D. Glenn in "Space Station Heat Pipe Advanced Radiator Element II," Research and Technology Report, Lyndon B. Johnson Space Center, Houston, Tex. (1991)

The systems described in "Mobile Heat Pipe Air Conditioner", supra, can be further enhanced by the use of the concepts of this invention of "coupling" and "flux transforming" whether at low or high operating temperatures.

This invention enhances the cooling of large heat fluxes in small places by extending what is referred to as:
1. Macro-"fiber" cooling characterized as flexible, variable cross-section heat pipes and separable from heat generating components,
2. Micro-"capillary" cooling high volume, low flow rate, low pressure system, and integrated into heat generating components.

Heat pipes have numerous applications. Inasmuch as a heat pipe is a very efficient energy transport device and since every industrial activity involves energy use in one form or another (primarily in heating and cooling) derivative heat pipes are expected to be pervasive in all sectors of industry, provided that they are simple to use, reliable and cost effective. Heat pipes should satisfy the needs of industry when they are made to incorporate this invention. There are many different applications ranging from flexible, "capillary heat pipe" type medical applications to computer-"wear" on civilians and soldiers in the field, to solar panels on roof tops, to computers, avionics and to aerospace.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

While immersion cooling can alleviate some of the critical problems at the component cooling level or other difficult cooling problems such as space program applications, other problems associated with transferring heat to the system level and then on to the ultimate heat sink, by means of pumps, blowers, fans, heat-exchangers, etc. can be daunting. Besides, there is the question of how to fit all that into the "shawl computer" that was mentioned earlier. There is an alternative which comprises a heat pipe designed to exploit the special characteristics of electronic systems.

Heat pipes work on the principle of phase-change between the liquid and vapor states, which yields the highest heat transfer rates. Since in a properly working heat pipe the phase change occurs directly without boiling, the attendant problems of DNC (Departure from Natural Convection S. Oktay, "Departure from Natural Convection (DNC) in Low-Temperature Boiling Heat Transfer Encountered in Cooling Micro-Electronic LSI Devices," Proceedings of the 7th International Heat Transfer Conference, pp. 113–118, Munchen, Germany, (Sep. 1982) and temperature overshoot are circumvented. Furthermore, a much wider selection of fluids beyond the fluorocarbons (FCs) is now made possible since the working fluid are confined to the inside of the heat pipe, with the only proviso that the fluid be compatible with the material of the chip, which is often silicon.

Figure 2A:
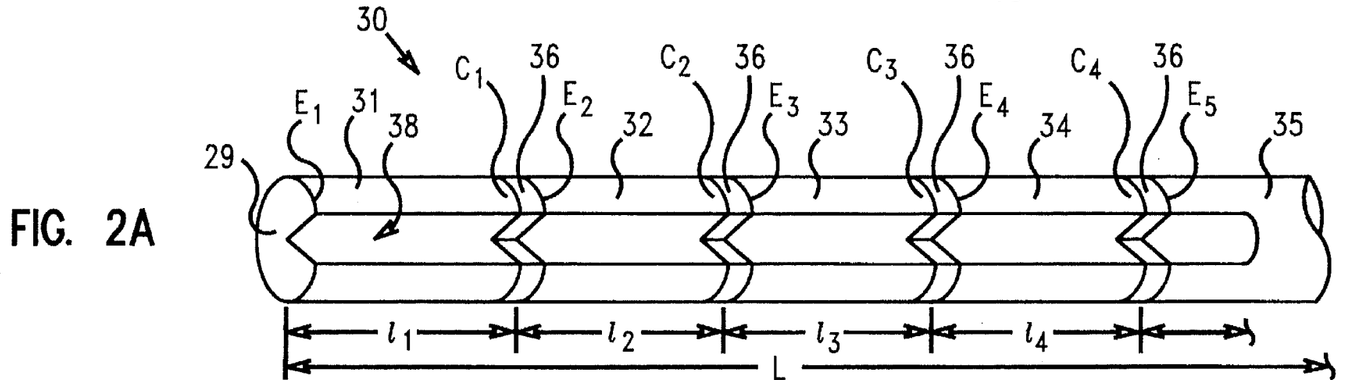
FIG. 2A shows a cascaded series of heat pipes in accordance with this invention having uniform cylindrical cross section.
Figure 2B:
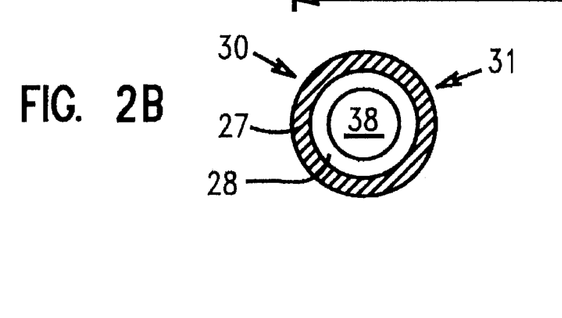
FIG. 2B shows an enlarged transverse cross-sectional view of one of the heat pipes of the device of FIG. 2A.

In accordance with this invention a series of configurations of heat pipes (or thermosiphons) is provided. Each configuration has an evaporator at the proximal end thereof, nearest to the device requiring cooling, and a condenser at the distal end thereof. One aspect of the invention is the use of "cascaded" heat pipes. FIG. 2A shows a cascaded series of heat pipes in accordance with this invention having uniform cylindrical cross section. That is to say that there are multiple-stage, coupled heat pipes as shown in FIGS. 2A, 3, 4 and 5. In this type of embodiment of the invention, referring to FIG. 2A, for example, the outer surfaces of the condenser of one heat-pipe 31 becomes the integral part of the evaporator of the next heat pipe 32 and so on along a cascade of heat pipes 31, 32, 33, 34, 35. The pipes in the cascade of heat pipes are preferably fastened together mechanically by screwing one end of a first heat pipe to the receiving end of the next heat pipe, although permanent bonding can be employed. Each section of a cascaded heat pipe system has its own characteristics, i.e. fluid, wicking material, etc. for the desired temperature drop and length. In this way the outer surfaces of the condenser of a heat pipe and the evaporator of the next one become integral with each other, and so on up the cascade of heat pipes. FIG. 2B shows an enlarged transverse cross-sectional (end) view of the heat pipe 31 of the device 30 of FIG. 2A with the metal cylinder wall 27 lined with the capillary material 28 enclosing the space 38 in which vapor travels from the evaporator to the condenser.

Figure 4:
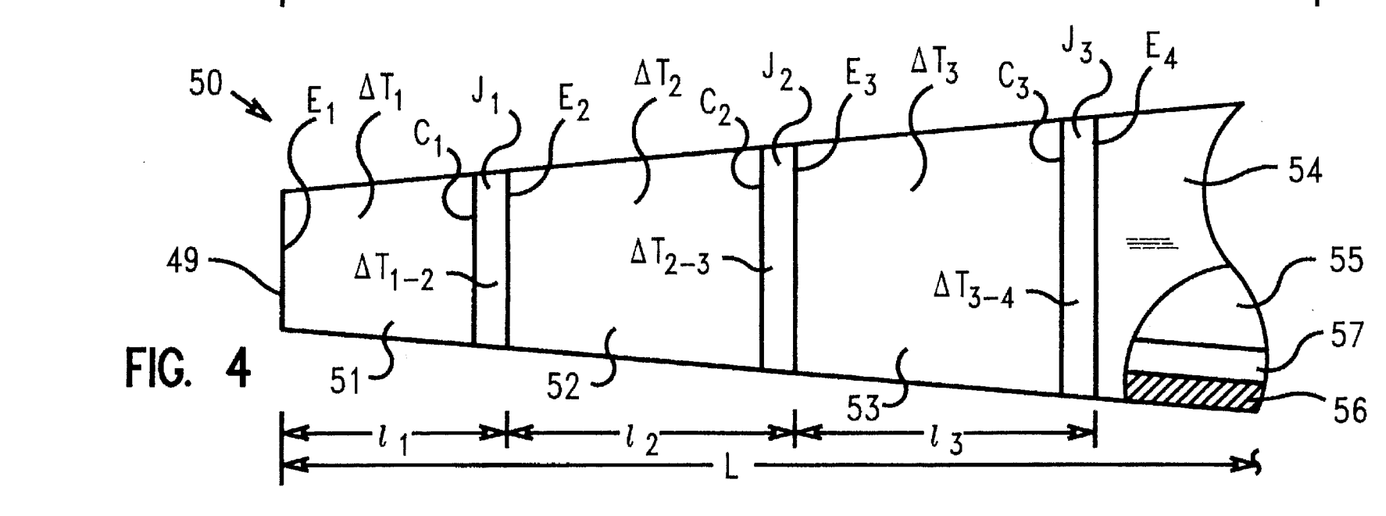
FIG. 4 shows cascaded heat pipe sections in accordance with this invention which are of a smooth-function increasing cross section from the evaporator to the condenser of a given stage, with each stage having a larger cross-section at the evaporator than the cross-section of the condenser of the previous stage.

Using American Standard straight pipe threads with 11.5 threads per inch over an overlapping length of 1 inch, the thermal resistance of the joint is $R_\mu=0.02K/W$. The thermal resistance of three coupled heat pipes as shown in FIG. 4 from the evaporator section $E_1$ of the first heat pipe 51 to the condenser $C_3$ of the third heat pipe 53 is $$R_{hp-3}=(3\times0.31)+2\times0.02)=0.97° C./Watt$$

Thus one is able to transport 60.6 watts over a distance of three (3) feet or approximately 1 meter, with a temperature drop of only 58.8° C. (It should be noted that in the preferred embodiment the four staged pipes 51, 52, 53 and 54 in FIG. 4 are "fine-tuned" separately with their own fluids, operating ranges to compensate for any temperature drops in the common joints $J_1$, $J_2$ and $J_3$ between the staged pipes 51, 52, 53 and evaporator $E_4$ of a fragment of still another staged pipe 54, etc. The fluids suitable for use in the heat pipes are water, refrigerants in gneral, fluorocarbons, alcohols such as methyl alcohol ($CH_3OH$), ethyl alcohol ($C_2H_5OH$). Finally, in order to transfer heat from the coupled heat pipes 51–54, etc. into the surrounding environment, the surface of the third or final condenser may be cooled by ways from direct liquid cooling to air cooling. By employing a three section cascaded version of the variable-cross section designs exemplified by pipes 51, 52 and 53 in FIG. 4 the surface area of the condenser $C_3$ is increased sufficiently to obtain a thermal resistance of as follows:

$R_s = 0.28°$ C./Watt where $R_s$=resistance of surface area of condenser, with an air flow velocity of 3 m/sec. Hence, the total thermal resistance becomes $R_t = R_{hp-3} + R_s$ where $R_t$=total resistance of heat pipe and fins, $R_{hp-3}$=resistance of heat pipes 1, 2 and 3, $R_tV = 0.97°$ C./Watt+$0.28°$ C./Watt $R_t = 1.25°$ C./Watt yielding a total temperature drop of Delta-T=60.6 Watts×1.25° C./Watt=75.75° C.

over a distance of about 1 meter, which is remarkable. At 40 watts, the temperature difference is 50° C. Clearly, since the adiabatic resistance $R_g$ is negligible, the longer the heat pipe, the more remarkable are the heat transport capabilities of the cascaded heat pipe. The penalty of incurring temperature drop across intermediate evaporator-condenser sections of a cascaded heat pipe system is made minimal. In FIG. 2A, the heat pipes 31, 32, 33, 34, and 35 are of conventional cylindrical cross-section and conventional profile.

Figure 3:
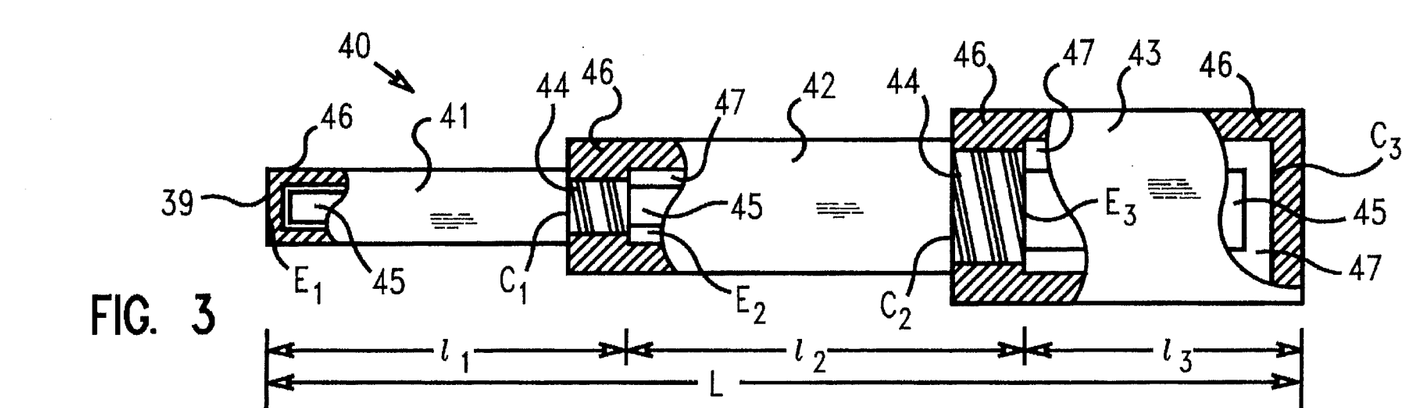
FIG. 3 shows a cascaded set of heat pipes in accordance with this invention, the heat pipes each being of fixed radius (cylindrical) and those heat pipe sections an "n" stage coupled step-function cascaded profile where each of the n sections has a larger cross sectional radius moving away from the first evaporator $E_1$ and going to the last condenser $C_n$.

In FIG. 3, the source of heat is to be placed in contact with the $E_1$ evaporator end 39 of cylindrical heat pipe section 41. Each of the cylindrical heat pipe sections 41, 42, and 43 is of fixed radius (cylindrical) and those heat pipe sections 41, 42, and 43 represent an "n" stage coupled step-function cascaded profile where each of those n sections has a larger cross sectional radius moving away from the first evaporator $E_1$ and going to the last condenser $C_n$.

Alternatively, as in FIG. 4, the heat pipe sections 51, 52, 53, and 54 are of a smooth-function increasing cross section from the evaporator to the condenser of a given stage, with each stage having a larger cross-section at the evaporator than the cross-section of the condenser of the previous stage. A second arrangement is one in which the individual sections are of variable cross-section profile.

Referring in greater detail to FIG. 2A, a cascaded heat pipe device 30 starts with the evaporator $E_1$ at the end 29 which contacts the device to be cooled. The cascade of heat pipes 31, 32, 33, 34, and 35, etc. has an overall length L. The heat pipes 31, 32, 33, 34, and 35, etc. are connected together by common joints 36. The first pipe 31 of length $l_1$ includes evaporator $E_1$ at the proximal end 29 and condenser $C_1$ at its distal end. The second pipe 32 of length $l_2$ includes evaporator $E_2$ at its proximal end and condenser $C_2$ at its distal end. The third pipe 33 of length $l_3$ includes evaporator $E_3$ at its proximal end and condenser $C_3$ at its distal end. The fourth pipe 34 of length $l_4$ includes evaporator $E_4$ at its proximal end and condenser $C_4$ at its distal end. The fifth pipe 35 includes evaporator $E_5$ at its proximal end and condenser (not shown) at its distal end. The condenser $C_1$ . . . $C_n$ of the previous stage is connected to the evaporator $E_2$ . . . $E_n$ by means of a common joint 36.

Referring to FIG. 3, there is a cascade of three heat pipes 41, 42, 43 having radii increasing as a step function along the cascade connected by threaded joints 44 as described above with the smaller pipe 41 threaded at the end with a male (external) thread into the larger pipe 42 which has a female (internal) threaded pipe opening. The first pipe 41 includes evaporator $E_1$ at the proximal end 39 and condenser $C_1$ at its distal end. The second pipe 42 includes evaporator $E_2$ at its proximal end and condenser $C_2$ at its distal end. The third pipe 43 includes evaporator $E_3$ at its proximal end and condenser $C_3$ at its distal end. To summarize, a condenser $C_1$ . . . $C_{n-1}$ of the previous stage is connected to the evaporator $E_2$ . . . $E_n$ by means of the threaded joints 44. The metal cylinder wall 46 of the pipes are lined with the capillary material 47 enclosing the spaces 44 in heat pipes 41, 42 and 43 in which vapor travels from the evaporator to the condenser. The lengths $l_1$–$l_3$ show that in effect any one of the small lengths "$l_n$" can be lengthened to a large "L".

Referring to FIG. 4, there is a device 50 comprising a cascade of three frustro-conical heat pipes 51, 52, 53 having radii increasing as a function of length along the cascade connected by threaded joints $J_1, J_2, J_3$ above with the smaller pipe 51 threaded into the joint $J_1$ larger pipe 52 which has a female (internal) threaded pipe opening. The first pipe 51 includes evaporator $E_1$ at the proximal end 49 and condenser $C_1$ at its distal end. The second pipe 52 includes evaporator $E_2$ at its proximal end and condenser $C_2$ at its distal end. The third pipe 53 includes evaporator $E_3$ at its proximal end and condenser $C_3$ at its distal end. The fourth pipe 54 includes evaporator $E_4$ at its proximal end and condenser (not shown) at its distal end. The condenser $C_1$ . . . $C_n$ of the previous stage is connected to the evaporator $E_2$ . . . $E_n$ by means of a common joints $J_1, J_2, J_3$.

In FIGS. 2–4, the exterior walls of the heat pipes are composed of metal such as copper, aluminum and steel, as well as composite materials such as an aromatic polyamide fiber of extremely high tenside strength (Kevlar, trademark of E.I. DuPont de Nemours,) polyamide (high molecular weight polymers with amide linkages (—CONH—) occurring along the molecular chain), polyimide (high polymers with an imide group (—CONHCO—) in the polymer chain), nylon (polyamide polymers with the amide group (—CONH)), and polytetrafluoroethylene (Teflon, trademark of E.I. DuPont de Nemours.)

Figure 5:
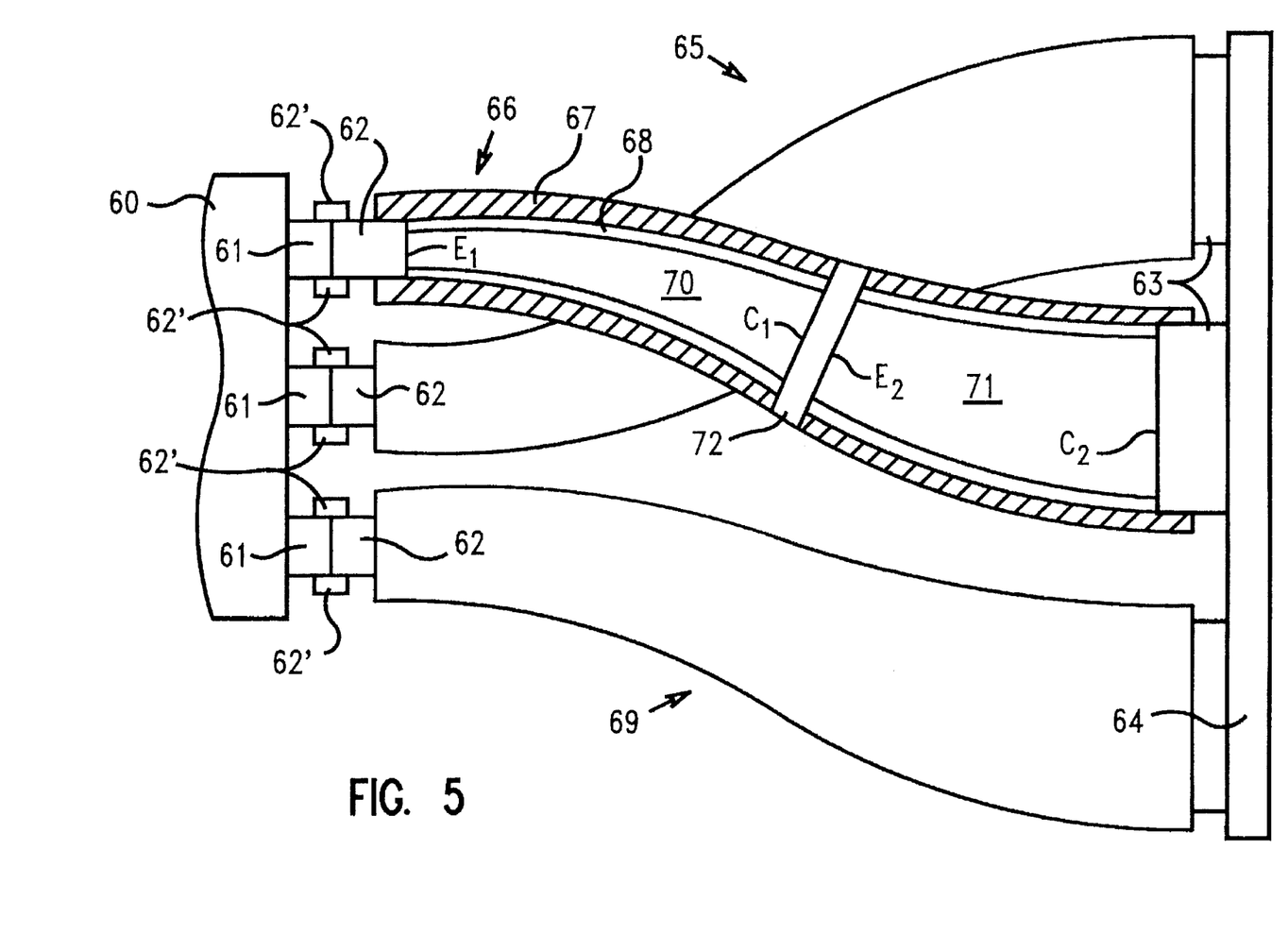
FIG. 5 shows an portion of an electronic system with an arrangement of flexible heat pipes connected between chips on a substrate and the box cover housing the electronic system.

Wicking materials 47 in FIG. 3, 57 in FIG. 4, 68 in FIG. 5.

Figure 6A:
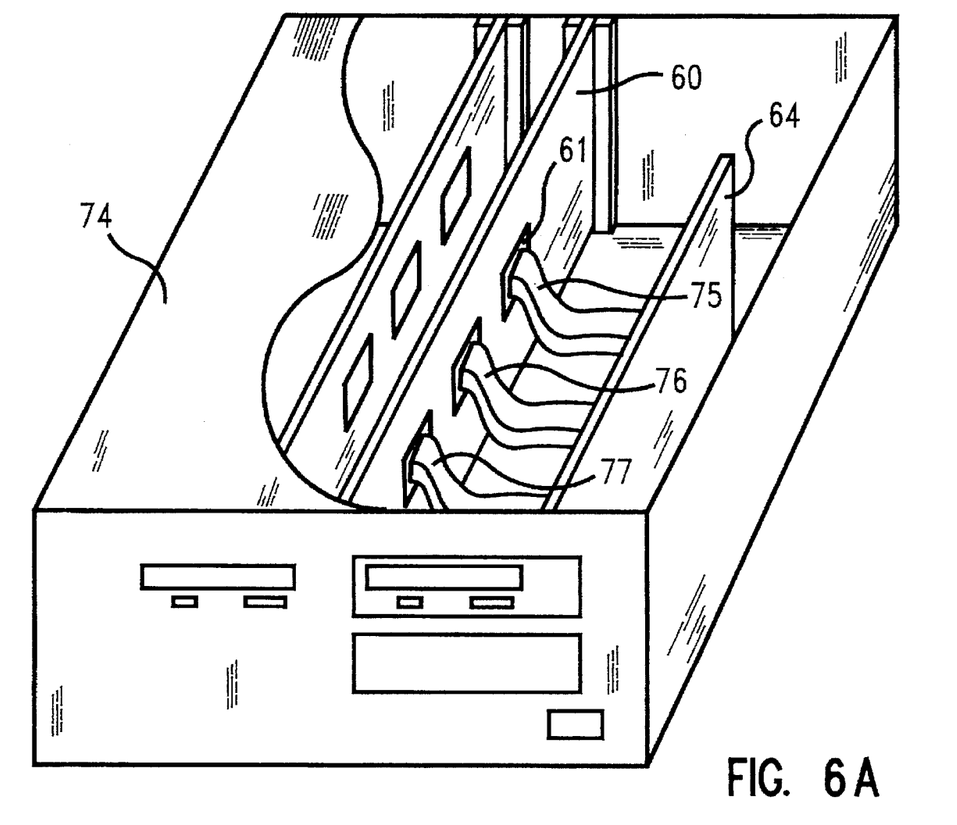
FIGS. 6A and 6B show heat pipe connections for a microcomputer between a chip and a metal wall secured to the box housing the microcomputer.

Referring to FIG. 6A, the evaporator section is preferably made out of silicon and sealed to the proximal end of the heat pipe which in turn is soldered to the functional chip. The distal end of the heat pipe is judiciously fixed to a heat dissipating member of the computer box. Because there is so much more area available on the surface of the box, what may have required a fan for cooling of the chips with a conventional design, in accordance with this aspect of the invention, natural convection off the surfaces of the box suffices. Obviously, if the box becomes too hot to touch, then convection fans can be used to enhance cooling efficiency to cool the box. The heat pipes are made flexible and also supported by appropriate fixtures. Furthermore the heat pipes are preferably funnel shaped with a variable cross section to satisfy two purposes:

1) transform the high heat flux at the evaporator section to a lower flux level at the condenser end, and 2) alter favorably the burnout characteristics of an otherwise constant cross-section heat pipe by being able to specify the appropriate chamber volume for a given type of liquid used in the heat pipe.

To overcome the usual working length restrictions of heat pipes, in accordance with this invention, one uses "cascaded" heat pipes as shown in FIGS. 2A, 3 and 4. In this arrangement, referring to FIG. 4, the condenser $C_1$ of the first heat pipe 51 becomes the evaporator $E_2$ of the second heat pipe 52, and so on up a cascade of heat pipes 51, 52, 53, 54, etc. It can be shown that the penalty of incurring temperature drops across intermediate evaporator-condenser sections can be made minimal. The cascaded pipes 51, 52, 53 and 54 are composed of any conventional piping material including as examples materials such as a metal (e.g. copper, aluminum, steel) or a composition of polyimides. The pipes 51, 52, 53 and 54 can be joined by variable sleeve length, threaded connections with a high degree of match in the pitch of the threads to provide maximum heat transfer. It is possible to provide a soldered joint between sections or a combination of threads and solder in the connection to afford maximum conductive heat transfer. The coolant employed can be selected from a group of conventional refrigerants such as water, fluorocarbons, liquid nitrogen and other refrigerants which convert from liquid to gas within the range of temperatures at which the heat pipe operates.

There is an optimum length $l_1, l_2, l_3, l_n$ for a heat pipe 51, 52, 53, etc. in FIG. 4 and the same is true analogously in FIGS. 2A, 3, etc. since the vapor in the heat pipe becomes choked beyond the optimum length. Each heat pipe includes conventional wicking materials which are adapted to carry the liquefied coolant from the condenser to the evaporator of the pipe for recycled evaporation in accordance with conventional cooling and refrigeration principles as described above in connection with the description of related art. The wicking materials can be conventional materials; and in particular, cotton cloth, mesh structure materials are preferred for such use.

FIG. 5 shows an portion of an electronic system 69 with an arrangement of flexible heat pipes 65, 66, 67 connected between chips 61 on a substrate 60 to transfer heat to the box cover 64 housing the electronic system 69.

The semi-conductor substrate 60 carries a number of chips 61 which require cooling and which are mechanically connected by junction units 62 serving as evaporators $E_1$ for heat pipes 65, 66 and 67. Units 62 are composed of a material selected from aluminum, copper or preferably gallium arsenide or silicon to match the coefficient of thermal expansion of the silicon material of chips 61.

The junction units 62 are thermally connected to the chips 61 by means of low temperature solders such as Woods metal, alloys of indium or cadmium and the like to transfer heat efficiently and at the same time permit easy separation of the components. See Oktay et al U.S. Pat. No. 4,607,277 for "Semiconductor Assembly Employing Non Eutectic Alloy for Heat Dissipation."

Flexible heat pipes 65, 66 and 67 are preferably composed of polyimides. Alternatively, flexible copper pipes are used for heat pipes 65, 66 and 67. The wicking material is inserted into the flexible heat pipes 65, 66 and 69 by sliding it into the pipes.

The flexible heat pipes 65, 66 and 69 are connected at the proximal ends to the chips 61 and at their distal ends through joints 63 (serving as the condenser $C_2$) to the electronic box 64 which contains, among many other things, the substrate 60, etc. for the purpose of cooling by convection currents from the air surrounding the box 64. One cascaded heat pipe 66 is shown in section to show the flexible exterior walls 69 of the pipe 66 lined with flexible wicking material 68. The adiabatic interior spaces 70 and 71 of the two pipe stacked arrangement are separated by a common joint 72 which is both the condenser $C_1$ for the interior space 70 and the evaporator $E_2$ for the interior space 71. Heat pipe stages vary in cross-sectional area continuously and non-linearly, as shown by the nonlinear cross sections of the walls of interior spaces 70 and 71 of pipe 67.

The flexible material 67 is selected from the many well known polymeric materials such as an aromatic polyamide fiber of extremely high tenside strength (Kevlar fiber), polytetrafluoroethylene, nylon, or polyimides which contain the coolant and are relatively easily relocated with substantially the flexibility of an electrical connection cable or an air hose. As a practical matter the specific material 67 and the specific coolant used in the heat pipes must be compatible.

Figure 6B:
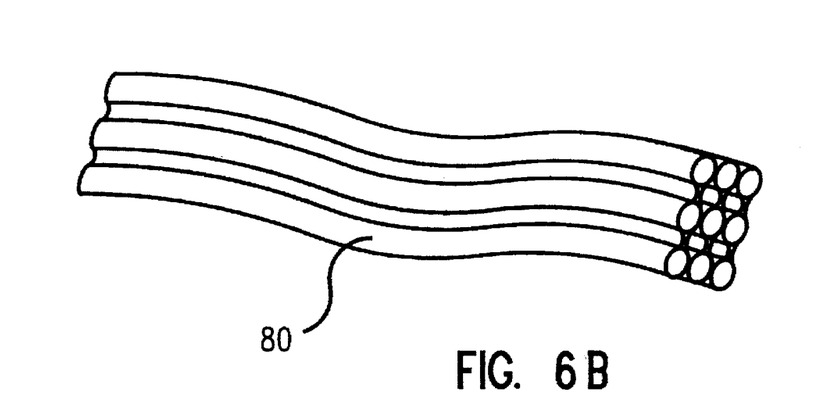

FIGS. 6A and 6B show flexible heat pipes 75, 76 and 77 connecting a microcomputer between chips 61 on a substrate 60 and a metal wall 64 secured to the box 74 housing the microcomputer. One possible way of connecting chips to the covers of a computer box is shown in FIG. 6A. It may also be possible to mount a bundle of micro flexible heat pipes on a chip. One could then apply this scheme to cool, say, a "10 MIP shawl computer." Assuming that a 1 centimeter square single chip processor in the shawl dissipates 10 watts, then the power density at the chip level is 10 W-cm-2. By transporting this heat flux to an area of approximately 10 cm×10 cm on the outer surfaces of the shawl, the heat flux can then be reduced to about 0.1 W-cm$^{-2}$, which is readily coolable by natural convection. The bundle of micro-flexible heat pipes fanning out from the chip is attached to "metal buttons" "woven" into the fabric of the shawl. Similar approaches could be applied to the silent cooling of Personal Computers and Work Stations.

An application is cooling a personal computer with flexible heat pipes. Of course, the motivation for all this is that there is more than adequate free surface area on most computer boxes to be able to "cool to touch" by natural convection.

The ability to control high heat fluxes at the heat source by means of phase change, and then to be able transport and transform to lower heat fluxes by means of heat pipes seems a promising way for extending the thermal limits as we know them today. The work going on in these areas is encouraging. At the same time, it is instructive to examine the origins of thermal limits as they relate to the packing requirements in computer systems.

SUMMARY

This invention includes several features as follows:
1. A method for constructing a heat pipe of "infinite" length and variable cross-section.
2. Staged heat pipes as an integral part of a one-piece heat pipe?
3. Individual heat pipes with variable sleeve lengths that can be screwed to each other.
4. Either one-piece or individual heat pipes with variable cross-sections.

The preceding features are used as follows:
1. For construction of cascaded heat pipes of any lengths,
2. Alleviating the problem of fluid starvation in heat pipes.

SUMMARY

Some advantages of the "coupled, flux transformer over conventional heat pipes are as follows:
1. removal of length limitation.
2. addition of flux transforming capability.

Those advantages greatly enhance the value of heat pipes as contrasted to conventional cooling systems. Consider, for example, the hat pipe radiator systems for the Space Station Freedom (SSF.) As stated above it has been shown there that the high capacity heat pipe radiators offer several advantages over conventional heat-rejection methods as described by Steven D. Glenn in "Space Station Heat Pipe Advanced Radiator Element II," Research and Technology Report, Lyndon B. Johnson Space Center, Houston, Tex. (1991)

The systems described in "Mobile Heat Pipe Air Conditioner", supra, can be further enhanced by the use of the concepts of this invention of "coupling" and "flux transforming" whether at low or high operating temperatures.

This invention enhances the cooling of large heat fluxes in small places by extending what is referred to as:

1. Macro-"fiber" cooling characterized as flexible, variable cross-section heat pipes and separable from heat generating components, 2. Micro-"capillary" cooling high volume, low flow rate, low pressure system, and integrated into heat generating components.

Heat pipes have numerous applications. Inasmuch as a heat pipe is a very efficient energy transport device and since every industrial activity involves energy use in one form or another (primarily in heating and cooling) derivative heat pipes are expected to be pervasive in all sectors of industry, provided that they are simple to use, reliable and cost effective. Heat pipes should satisfy the needs of industry when they are made to incorporate this invention. There are many different applications ranging from flexible, "capillary heat pipe" type medical applications to computer-"wear" on civilians and soldiers in the field, to solar panels on roof tops, to computers, avionics and to aerospace.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A heat pipe including:
   a heat input end including an evaporator,
   a hollow adiabatic section, and
   an output end including a condenser,
   said evaporator and said condenser being joined by said hollow adiabatic section containing a wicking material and a coolant,
   said heat pipe having a larger inner cross-sectional area at said condenser than at said evaporator,
   said heat pipe including a plurality of individual, flexible heat pipe stages connected in cascade with the condenser of the preceding stage secured directly by a joint to the corresponding evaporator of a succeeding stage leading from a proximal input end of a first one of said stages to a distal, output end of a last one of said stages, with the condenser of the preceding stage integral with the evaporator of the succeed stage, and
   each of said stages having a larger inner cross-sectional area at the condenser thereof than at the evaporator thereof.

2. A device in accordance with claim 1 wherein said heat pipe stages have said condenser of one of said heat pipe stages and said corresponding evaporator of a succeeding one of said heat pipe stages screwed together.

3. A device in accordance with claim 1 wherein said stages of heat pipes are interconnected to form an integral part of a unitary heat pipe for maximum heat transfer.

4. A device in accordance with claim 1 wherein said individual heat pipe stages are interconnected by sleeves of variable lengths screwed one into the other.

5. A device in accordance with claim 1 wherein said heat pipe stages are composed of flexible material.

6. A device in accordance with claim 1 wherein each of said heat pipe stages is composed of flexible material and
   said heat pipe is connected at said distal, output end to a heat dissipating member.

7. A device in accordance with claim 3 wherein said heat pipe is composed of flexible material, and
   said heat pipe is connected at said distal, output end to a heat dissipating member.

8. A device in accordance with claim 4 wherein said heat pipe stages are composed of flexible material, and
   the condenser at the distal output end of said pipe is connected to a heat dissipating member.

9. A heat pipe device including:
   a plurality of heat pipe stages, each of said heat pipe stages including: a heat input end including an evaporator,
   a hollow adiabatic section, and an output end including a condenser, with said evaporator and said condenser joined by said hollow adiabatic section containing a wicking material and a coolant,
   said plurality of heat pipe stages being connected in cascade with the condenser of the preceding stage secured integrally and directly by a joint to the corresponding evaporator of the succeeding stage, said joint providing for maximum heat transfer, and
   each of said stages having a larger inner cross-sectional area at said condenser thereof than at said evaporator thereof, with a first stage of said stages of said heat pipe including at its said evaporator a heat input end for said heat pipe device and the last of said stages of said heat pipe having an output end including the condenser of said last heat pipe stage.

10. A device in accordance with claim 9 wherein said heat pipe stages are interconnected with said condenser and said corresponding evaporator of said succeeding stage being screwed together.

11. A device in accordance with claim 9 wherein said heat pipe heat pipes are interconnected to form an integral part of a unitary heat pipe.

12. A device in accordance with claim 9 wherein individual heat pipes stages are interconnected by sleeves of variable lengths screwed one into the other.

13. A device in accordance with claim 11 wherein said heat pipe stages have said condenser and said corresponding evaporator screwed together and each of said heat pipes comprises an integral structure including an evaporator, an adiabatic section and a condenser section, and
   said heat pipe stages vary continuously in cross-sectional area.

14. A device in accordance with claim 9 wherein said heat pipe stages are composed of flexible material.

15. A device in accordance with claim 10 wherein said heat pipe stages are composed of flexible material.

16. A device in accordance with claim 11 wherein said heat pipe stages are composed of flexible material,
   each of said heat pipes stages comprises an integral structure including an evaporator, an adiabatic section and a condenser section, and
   said heat pipe stages vary continuously and non-linearly in cross-sectional area.

17. A semiconductor substrate carrying a plurality of semiconductor chips and a package for cooling said semiconductor chips, said package including cooling apparatus including a heat pipe device with a heat input end including an evaporator, and a hollow adiabatic section, an output end including a condenser, with said evaporator and said condenser joined by said hollow adiabatic section containing a wicking material and a coolant,     said heat pipe including a plurality of heat pipe stages connected in cascade with the condenser of the preceding stage secured directly by a joint to the corresponding evaporator of the succeeding stage each of said stages having a larger inner cross-sectional area at said condenser thereof than at said evaporator thereof,     said individual heat pipes being interconnected by sleeves of variable lengths screwed one into the other to provide joints, wherein said device is connected to cool chips mounted on a substrate, said substrate being mounted in a box, and said heat pipe is composed of flexible material connected to said box containing said substrate as a heat sink,     the evaporator section of one of said heat pipe stages is made out of silicon which is sealed to the proximal end of the heat pipe which in turn is soldered to said chip, said joints providing for maximum heat transfer,     whereby said heat pipe and said box comprise an integral cooling structure for said semiconductor chip.

18. A device in accordance with claim 9 wherein said heat pipe stages increase in diameter in steps stage by stage and,     the distal, output end of said heat pipe is connected to a heat dissipating member.

19. A device in accordance with claim 18 wherein said heat pipe stages increase in diameter linearly stage by stage and within a stage,     said heat pipe stages connected in cascade being connected to chips by a low temperature solder selected from Woods metal and an alloy selected from the group consisting of the alloys of indium and cadmium.

20. A device in accordance with claim 1 wherein said heat pipe stages are composed of a material selected from the group consisting of copper, aluminum, steel, polymeric materials, an aromatic polyamide fiber of extremely high tensile strength, polytetrafluoroethylene, nylon, and polyimides.

* * * * *